US008810269B2

(12) United States Patent
Gong et al.

(10) Patent No.: US 8,810,269 B2
(45) Date of Patent: Aug. 19, 2014

(54) METHOD OF TESTING A SEMICONDUCTOR STRUCTURE

(71) Applicant: Xilinx, Inc., San Jose, CA (US)

(72) Inventors: Yuqing Gong, San Jose, CA (US); Henley Liu, San Jose, CA (US); Myongseob Kim, Pleasanton, CA (US); Suresh P. Parameswaran, Fremont, CA (US); Cheang-Whang Chang, Mountain View, CA (US); Boon Y. Ang, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 180 days.

(21) Appl. No.: 13/630,215

(22) Filed: Sep. 28, 2012

(65) Prior Publication Data
US 2014/0091819 A1    Apr. 3, 2014

(51) Int. Cl.
*G01R 31/3187* (2006.01)
(52) U.S. Cl.
USPC .................................................. 324/750.3
(58) Field of Classification Search
CPC ........... G01R 31/2884; G01R 31/2886; G01R 31/2879; H01L 22/34
See application file for complete search history.

(56) References Cited

U.S. PATENT DOCUMENTS

| | | | |
|---|---|---|---|
| 6,509,739 B1 | 1/2003 | Voogel et al. |
| 6,564,986 B1 | 5/2003 | Hsieh |
| 7,109,734 B2 | 9/2006 | Yuan et al. |
| 7,312,625 B1 | 12/2007 | Paak et al. |
| 7,429,867 B1 | 9/2008 | de Jong |
| 7,489,152 B2 | 2/2009 | Yuan et al. |
| 7,518,394 B1 | 4/2009 | Chirania et al. |
| 7,724,016 B2 | 5/2010 | Yuan et al. |
| 2003/0169061 A1 | 9/2003 | Miller et al. |
| 2003/0193344 A1 | 10/2003 | Cheng et al. |
| 2005/0088195 A1 | 4/2005 | Grilletto |
| 2009/0230976 A1 | 9/2009 | McElfresh et al. |

*Primary Examiner* — Jermele M Hollington
(74) *Attorney, Agent, or Firm* — LeRoy D. Maunu

(57) ABSTRACT

An integrated circuit (IC) comprises routing circuitry including a plurality of signal line segments in routing layers of the IC, and a plurality of micro-bump contacts coupled to the routing circuitry. The IC includes a plurality of test circuits coupled to respective subsets of the plurality of signal line segments. Each test circuit is configured to connect micro-bump contacts in the respective subset to form first and second sets of daisy chains. Each test circuit is configured to test the first and second sets of daisy chains for open circuits and test for short circuits between the first and second sets of daisy chains. Each test circuit is configured to determine the locations of detected open circuits and determine the locations of detected short circuits.

19 Claims, 9 Drawing Sheets

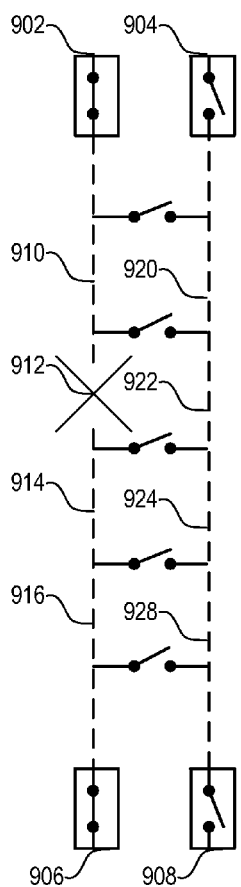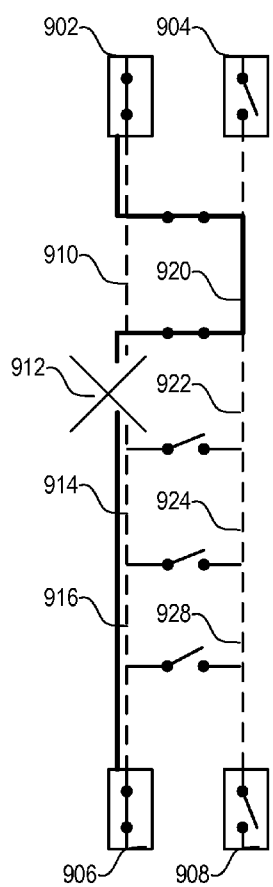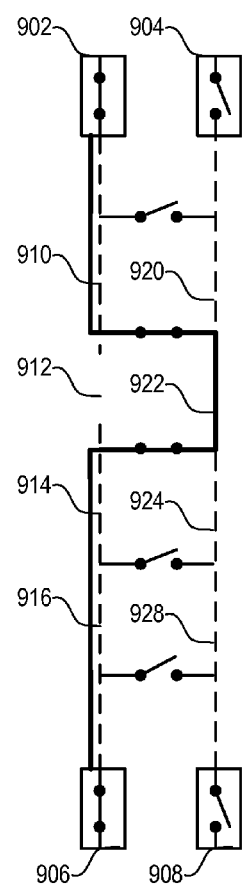
FIG. 9-1　　　　FIG. 9-2　　　　FIG. 9-3

METHOD OF TESTING A SEMICONDUCTOR STRUCTURE

TECHNICAL FIELD

The disclosure generally relates to the testing of integrated circuits (IC).

BACKGROUND

In many applications, it can be difficult to directly connect a die to another circuit or substrate, such as a printed circuit board (PCB). For example, if an integrated circuit (IC) is to be mounted on a PCB, wiring of the PCB may be too coarse to connect fine contacts of the integrated circuit. In such applications, the die and PCB may be interconnected through an interposer. An interposer is a silicon body having a first set of fine contacts (e.g., micro-bumps) on one side, to which a die may be bonded, and a second set of coarse contacts (e.g., C4 solder balls) on the other side for bonding to another chip, substrate, PCB, etc. Wiring and vias of the interposer may connect fine-pitched die contacts located on one side of the interposer to a coarser contact array on the opposite side of the interposer.

The set of fine or course contacts that bonds two ICs (e.g., an IC and an interposer) includes an array of bumps (e.g., micro-bumps or C4 solder balls) on the backside of one IC and a matching array of pads on the front-side of the second IC. For ease of reference, a micro-bump and pad pair may be collectively referred to herein as a micro-bump contact.

Defects may occur in new fabrication processes. To improve manufacturing processes, manufactured ICs are tested to detect undesirable defects, such as open and short circuits in micro-bump contacts. Once detected, these defects are analyzed to determine the location and type of the defects so the manufacturing processes may be modified to eliminate the resulting defects. However, the testing of micro-bump contacts can be difficult. Due to the large number of micro-bump contacts, it may take several hours to scan each micro-bump contact to determine the location of a failure. Determination of the location of the defect can be critical to the improvement of the fabrication processes.

SUMMARY

An integrated circuit (IC) includes routing circuitry, including a plurality of signal line segments in one or more routing layers of the IC, and a plurality of micro-bump contacts coupled to the routing circuitry. The IC includes a plurality of test circuits, each coupled to a subset of the plurality of signal line segments via a respective subset of the micro-bump contacts. Each test circuit is configured to connect micro-bump contacts in the respective subset of micro-bump contacts to form a first set of daisy chains of the subset of signal line segments and a second set of daisy chains of the subset of signal line segments. Each test circuit is configured to test for short circuits between the first set of daisy chains and the second set of daisy chains and test the first and second sets of daisy chains for open circuits. Each test circuit is configured to determine a portion of the daisy chain in which an open circuit is located in response to detecting the open circuit. Each test circuit is also configured to determine a location at which the first set of daisy chains is short circuited to the second set of daisy chains in response to detecting a short circuit between the first set of daisy chains and the second set of daisy chains.

Another IC includes an interposer having a plurality of solder balls arranged in an array and a plurality of through-silicon-vias respectively connected to the solder balls. The interposer also includes a plurality of micro-bump contacts and routing circuitry connected to the plurality of micro-bump contacts and the plurality of through-silicon-vias. The routing circuitry including a first set of signal lines in a first routing layer of the interposer and a second set of signal lines in a second routing layer of the interposer. The IC includes a plurality of test circuits. Each test circuit is coupled to a subset of the plurality of signal line segments via a respective subset of the micro-bump contacts. Each test circuit is configured to connect micro-bump contacts in the respective subset of micro-bump contacts to form a first set of daisy chains of the subset of signal line segments and a second set of daisy chains of the subset of signal line segments. Each test circuit is configured to test for short circuits between the first set of daisy chains and the second set of daisy chains and test the first and second sets of daisy chains for open circuits. Each test circuit is configured to determine a portion of the daisy chain in which an open circuit is located in response to detecting the open circuit. Each test circuit is also configured to determine a location at which the first set of daisy chains is short circuited to the second set of daisy chains in response to detecting a short circuit between the first set of daisy chains and the second set of daisy chains.

A method for testing micro-bump contacts of an interposer is also described. A plurality of test circuits having respective arrays of micro-bump contacts are mounted on respective subsets of the micro-bump contacts of the interposer. Each of the plurality of test circuits connect micro-bump contacts in the respective subset of micro-bump contacts to form a respective first set of daisy chains and a respective second set of daisy chains. The daisy chains are tested for short circuits between the first set of daisy chains and the second set of daisy chains. The first and second sets of daisy chains are also tested for open circuits. In response to detecting an open circuit in a daisy chain, a portion of the daisy chain in which the open circuit is located is determined. In response to detecting a short circuit between the first set of daisy chains and the second set of daisy chains, a location at which the first set of daisy chains is short circuited to the second set of daisy chains is determined.

Other embodiments will be recognized from consideration of the Detailed Description and Claims, which follow.

BRIEF DESCRIPTION OF THE DRAWINGS

Various aspects and advantages of the disclosed embodiments will become apparent upon review of the following detailed description and upon reference to the drawings, in which:

FIGS. 9-1 through 9-3 illustrate the determination of the location of an open circuit.

DETAILED DESCRIPTION

Methods and structures are described for testing micro-bump contacts used to connect stacked ICs. Multiple test circuits are connected to respective subsets of micro-bump contacts of a contact array of an IC. These and other connections described herein may be direct connections or may occur through one or more intervening circuit elements. The IC includes a set of signal line segments in one or more routing layers. The signal line segments connect respective pairs of the micro-bump contacts. Each test circuit is connected to a respective subset of the micro-bump contacts, and each test circuit is configured to connect the signal line segments and micro-bump contacts in series to form a respective first set and a respective second set of daisy chains. Each test circuit is further configured to test for shorted circuits between the first set of daisy chains and the second set of daisy chains and test the first and second sets of the daisy chains for open circuits. In response to detecting an open circuit in a daisy chain, the test circuit determines the portion of the daisy chain in which the open circuit is located. In response to detecting a shorted circuit, the test circuit is configured to determine the location of the shorted circuit. As used herein, the test circuits may be referred to as defect monitoring vehicles (DMVs), and such terms are used interchangeably herein.

Figure 1:
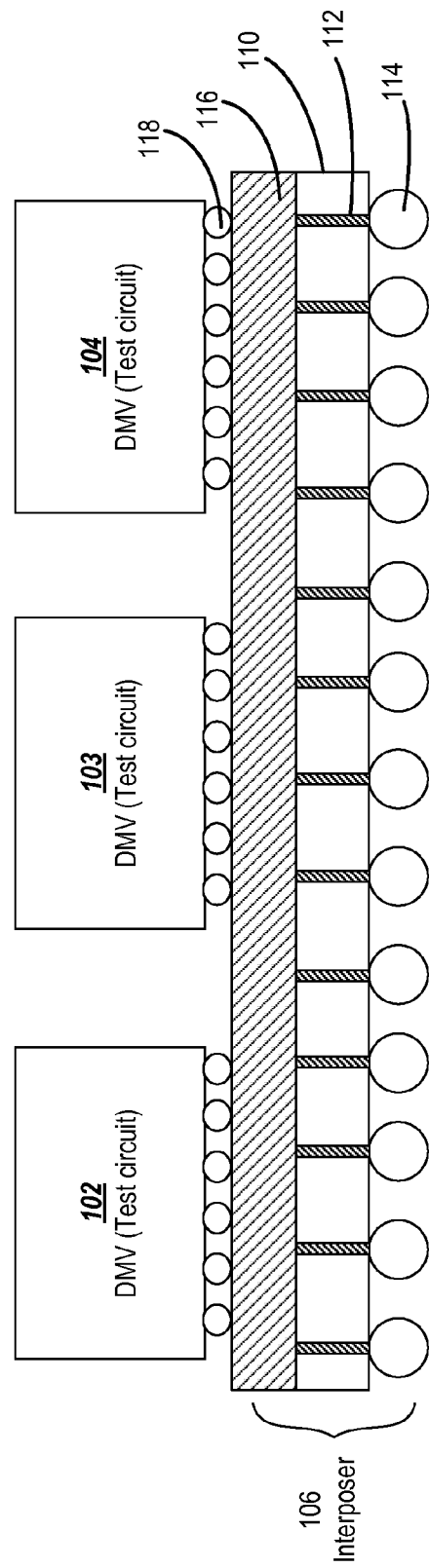
FIG. 1 shows a cross section of an interposer and multiple test circuits configured to test micro-bump contacts of the interposer for defects.

Test circuits may be applied to test micro bump contacts in a number of stacked IC applications. Multiple test circuits are connected to test respective subsets of micro-bump contacts on an interposer. For ease of illustration and explanation, the examples disclosed herein are primarily described with reference to the testing of micro-bump contacts of an interposer. FIG. 1 shows a cross section of an interposer and multiple test circuits configured to test micro-bump contacts of the interposer for defects. The interposer 106 includes a substrate body 110 having a number of through-silicon vias (TSVs) 112 formed in the body. A contact array having a plurality of C4 solder ball contacts 114 are formed on a backside of the interposer body 110. The solder ball contacts 114 are coupled to respective ones of the TSVs. One or more wiring layers 116 are formed on the front side of the interposer body 110. The wiring layer(s) implement multiple circuit paths that couple the TSVs to respective contact pads of a second contact array (not shown), which formed on the front side of the interposer. The second contact array is aligned and coupled with micro-bump contacts 118 of test circuits (e.g., 102, 103, and 104).

As described in more detail below, the routing layer 116 includes a number of signal line segments, each segment connecting a respective pair of the micro-bump contacts 118. The test circuits (102, 103, and 104) are configured to connect the signal line segments and micro-bump contacts in series to form respective sets of daisy chains. The test circuits (102, 103, and 104) are configured to detect an open circuit by testing for continuity of the daisy chains and detect short circuits by testing for continuity between different ones of the daisy chains.

For ease of explanation, functionality of the plurality of test circuits are primarily described in FIGS. 2 through 9 with reference to a single one of the test circuits mounted on an IC (e.g., an interposer).

Figure 2:
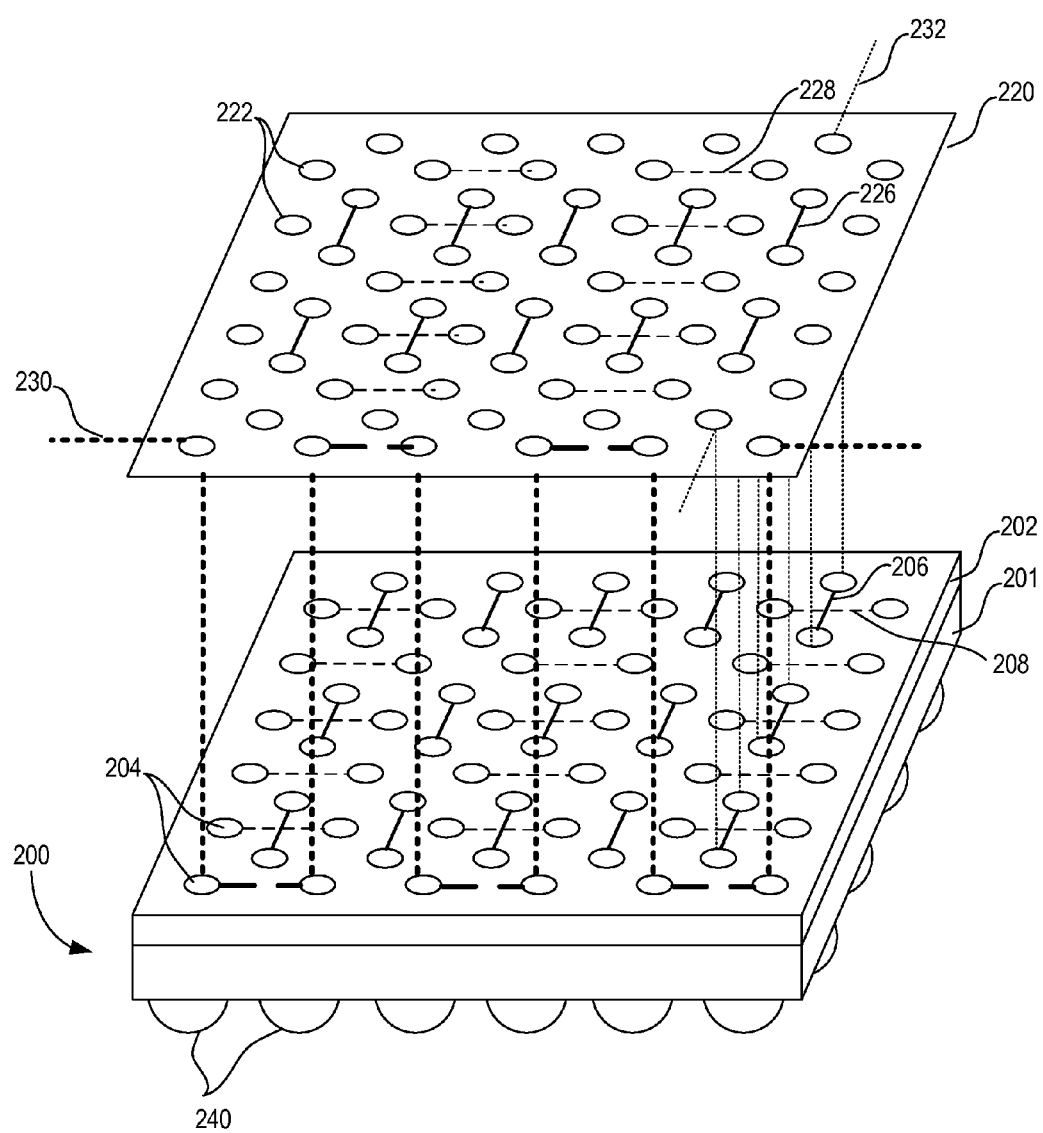
FIG. 2 illustrates connecting of routing segments and micro-bump contacts of an interposer into daisy chains for testing.

FIG. 2 shows a perspective view of an interposer and test circuit, in which signal line segments of the interposer and micro bumps are connected into daisy chains for testing. The interposer 200 includes one or more routing layers 202 formed on a silicon substrate 201 as described with reference to the interposer shown in FIG. 1. C4 solder bumps (e.g., 240) are formed on the backside of the silicon substrate 201 and connected to TSVs (not shown) formed in the silicon substrate 201.

Multiple micro-bump contact pads (e.g., 204) are formed on the surface of the interposer 200 and connected to the routing layers 202. The routing layers 202 include a number of signal line segments (e.g., 206 and 208) that may be used to connect micro-bump contacts in series to form one or more daisy chains.

The test circuit 220 includes multiple micro-bumps (e.g., 222) and signal line segments (e.g., 226 and 228) that may be aligned with and connected to micro-bump contact pads (e.g., 204) on top of the routing layers to connect signal line segments (e.g., 206 and 208) and micro-bump contact pads (e.g., 204) into a set of daisy chains. For ease of illustration, only a backside surface of a test circuit 220 is illustrated. The depicted micro-bumps (e.g., 222) and signal line segments (e.g., 226 and 228) are vertical projections onto the backside surface, which illustrate the positions of the micro-bumps and signal line segments in the test circuit.

In this example, each signal line segment (e.g., 206 and 208) of the interposer 200 connects a respective pair of the micro-bump contact pads (e.g., 204). The signal line segments that are shown as dashed lines (e.g., 208) are formed in a first routing layer, and the signal line segments that are shown as solid lines (e.g., 206) are formed in a second routing layer. When a test circuit is aligned with and connected to the micro-bump contact pads, micro-bumps and signal line segments (e.g., 226, 228) in the test circuit 220 connect signal line segments of the IC in series (via the micro-bump contacts) to form one or more daisy chains.

Signal line segments of the test circuit 220 that are shown as dashed lines (e.g., 228) in the depicted backside surface are formed in a first routing layer of the test circuit. Signal line segments of the test circuit 220 that are shown as solid lines (e.g., 226) in the depicted backside surface are formed in a second routing layer of the test circuit. As shown by circuit paths 230 and 232, the signal line segments of the routing layers 202 are connected to signal line segments of the routing layers of the test circuit to form daisy chains of signal line segments and micro-bump contacts.

In the example shown in FIG. 2, signal line segments are illustrated and described as overlapping and being disposed in two routing layers of the interposer and or in two routing layers of the test circuit. However, it is understood that signal lines may be located in any number of routing layers.

For ease of explanation the following examples are primarily illustrated and described using signal line segments that are arranged to form a first set of daisy chains that are oriented in a first x-axis and a second set of daisy chains that are oriented in a second y-axis. For example, daisy chain 230 is one daisy chain of the set of daisy chains oriented in the x-axis, and daisy chain 232 is one daisy chain of the set of daisy chains oriented in the y-axis. However, it is recognized that micro-bump contacts and signal line segments may be oriented in a number of alternative patterns that form different orientations of daisy chains.

Signal line segments of the test circuit and/or the routing layer of the interposer may be dynamically connected using active circuitry. For example, the test circuit may include MOSFET switches (not shown) that selectably connect each pair of micro-bump contacts to form the daisy chains while operating in a test mode. After testing is completed, the MOSFET switches may disconnect the pairs of micro-bump contacts. Disconnecting of the pairs of micro-bump contacts may facilitate other testing methods, which require micro-bump contacts to be isolated, without removing the test circuit.

Figure 3:
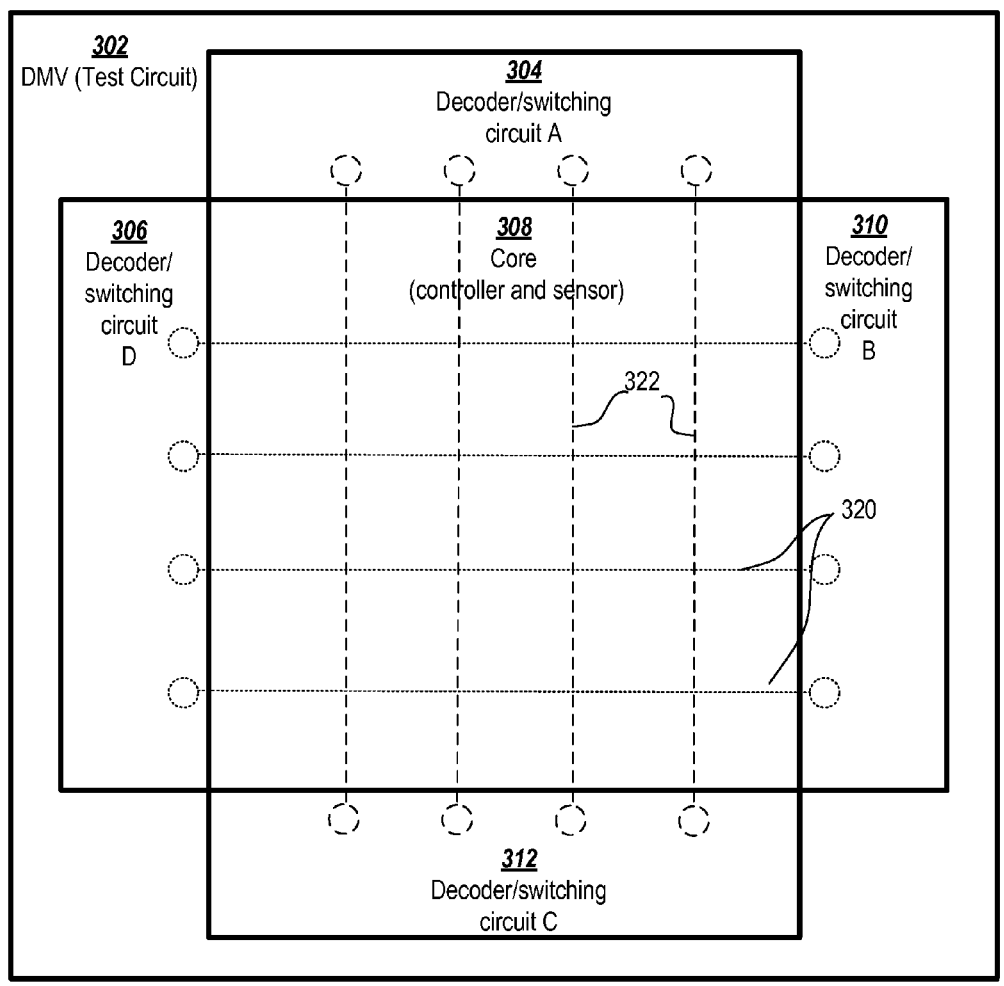
FIG. 3 shows a top view layout of a test circuit.

FIG. 3 shows a top view layout of a test circuit that may be used to implement a test circuit such as one or more of test circuits 102, 103, and 104 in FIG. 1. Test circuit 302 includes four switching circuits 304, 306, 310, and 312 that are configured to selectively connect daisy chains of signal line segments and micro-bump contacts to a continuity sensor (disposed in core circuit 308) for testing. For ease of explanation, daisy chains to be tested by the test circuit are illustrated as dashed lines (320 and 322). As described in more detail with reference to FIGS. 4 and 5, a control circuit (not shown) in the core circuit 308 connects the daisy chains to a sensor circuit, which detects and determines the location of any open circuit or any short circuit defects in the micro-bump contacts. As described in more detail with reference to FIGS. 6 through 10, select ones of first (320) and second (322) sets of the daisy chains may be systematically connected to automatically determine the location of detected open and short circuits in the daisy chains.

Figure 4:
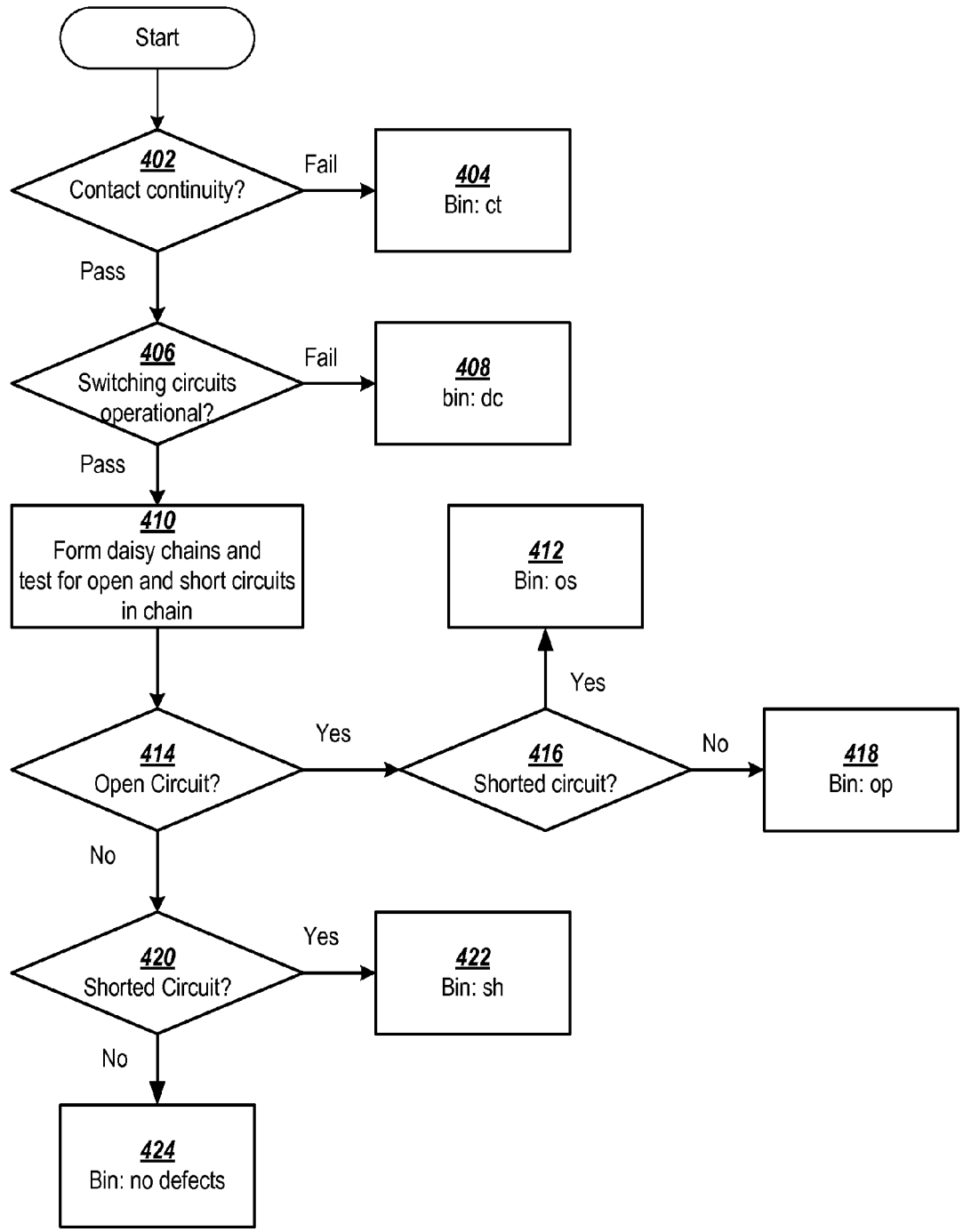
FIG. 4 shows a flowchart of an example process for testing micro-bump contacts of a stacked IC for defects.

Manufacture testing often categorizes tested IC into different groups (bins) based on the results of the testing. This grouping helps to facilitate additional testing to investigate how manufacturing processes may be improved to reduce the detected defects. FIG. 4 shows a flowchart of an example process for testing micro-bump contacts of a stacked IC for defects. Initially, test circuits are mounted to an IC (e.g., an interposer). The test circuits connect micro-bump contacts to form daisy chains. Following mounting of test circuits to an IC to be tested (e.g., an interposer) and connecting probes to probe pads, probe card pin check is performed to ensure continuity at block 402. If probing does not achieve continuity with each of the probe pads, the stacked IC is placed in a first bin referenced as ct (indicating continuity fault) at block 404. Otherwise, switching circuits are tested at block 406 to determine if the switching circuits respond to control signals from a control circuit. To perform this test, the control circuit may be configured to generate a predetermined sequence of control signals. Values of output terminals of the test circuit are monitored during testing to determine if the output values match a predetermined set of expected values. If output values do not match the set of expected values, the switching circuit is determined to be operating in error. If any switching circuit fails the test, the stacked IC is placed in a second bin referenced as sw (indicating fault of the switching circuit) at block 408.

If the switching circuits are found to be operational, daisy chains are tested for open and short circuits at block 410. If any of the daisy chains has an open circuit at decision block 414 and none of the daisy chains has a short circuit with another daisy chain at decision block 416, the stacked IC is placed in a third bin referenced as op (indicating open circuit fault) at block 418. If one or more of the daisy chains has an open circuit and one or more of the daisy chains has a short circuit, the stacked IC is placed in a fourth bin referenced as os (indicating both open and short circuit faults) at block 412. If none of the daisy chains has an open circuit at decision step 414 but one or more of the daisy chains has a shorted circuit at decision step 420, the IC is placed in a fifth bin referenced as sh (indicating short circuit fault) at block 422. Otherwise, if none of the daisy chains includes an open circuit or a shorted circuit, the IC is placed in a bin indicating that the IC has passed testing at block 424.

Figure 5:
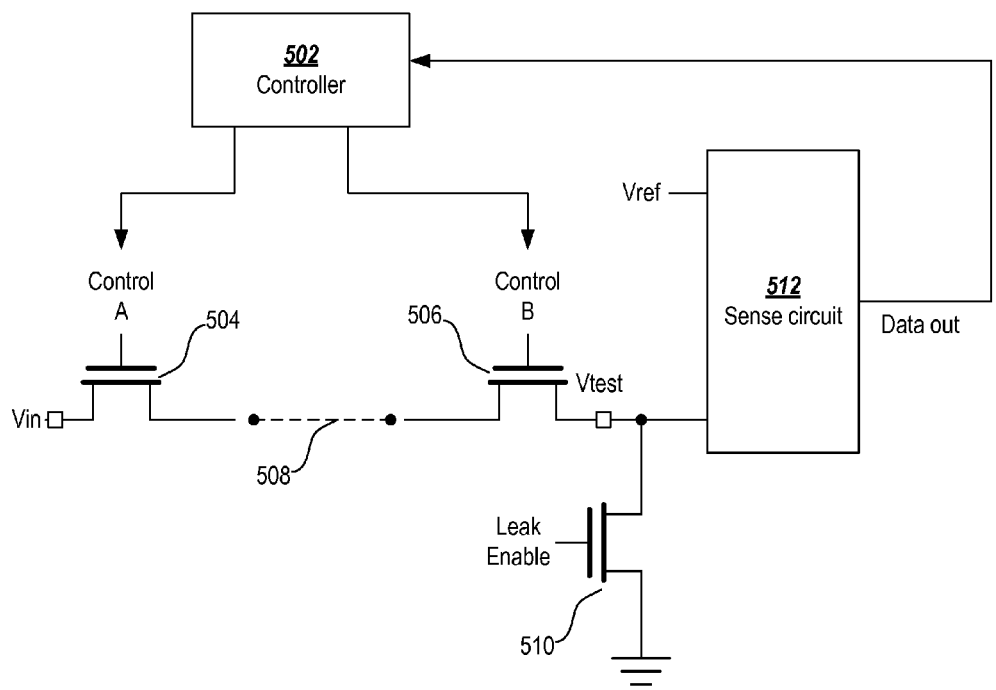
FIG. 5 shows a diagram of a circuit that may be used for testing various circuit paths for defects.

FIG. 5 shows a block diagram of a circuit that may be used for testing daisy chains for defects. A daisy chain is tested by connecting a first end of the daisy chain to be tested to a voltage source (Vin) and connecting either a second end of the daisy chain to a sense circuit 512 for testing continuity of the daisy chain, or connecting the end of another daisy chain to the sense circuit 512 for testing for a short circuit. The sense circuit 512 is configured to receive a voltage (Vtest) from the tested path and compare the voltage to a reference voltage (Vref). In response to control signals generated by control circuit 502, a daisy chain circuit path 508 is selectably connected to Vin by MOSFET switch 504 and to the sense circuit 512 by MOSFET switch 506.

When the daisy chain circuit path 508 is connected to Vin and the sense circuit 512, the sense circuit compares Vtest to the Vref voltage to determine if continuity is present. In addition, Vref may be varied to determine the approximate value of the resistance of the daisy chain. In this implementation, MOSFET 510 is configured to provide a small current path from the input of the sense circuit 512 to ground to prevent the voltage of the input from floating when the daisy chain under test (e.g., 508) includes an open circuit fault.

Figure 6:
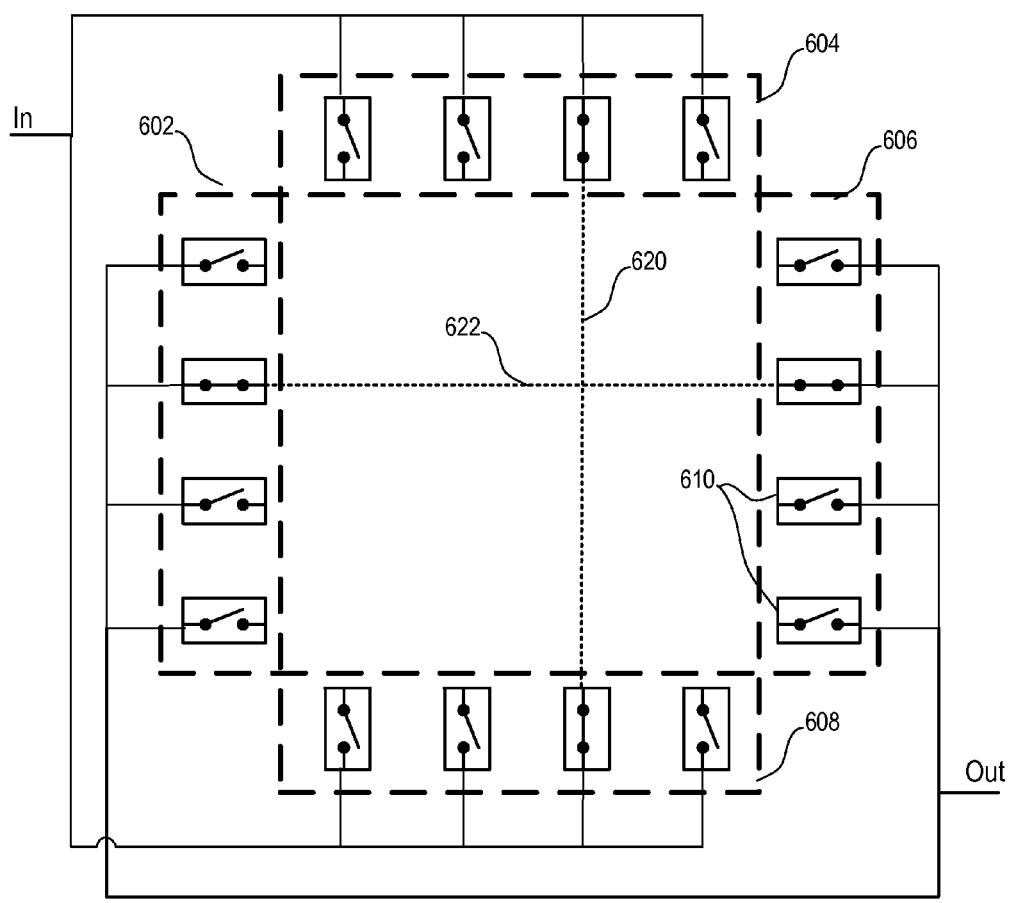
FIG. 6 shows the test circuit of FIG. 3 configured for testing micro-bump contacts to determine the locations of any short circuits.

As indicated above, selected ones of first and second sets of the daisy chains may be systematically connected to automatically determine the location of detected open and short circuits in the daisy chains. FIG. 6 shows the test circuit of FIG. 3 configured for testing micro-bump contacts to determine the location of a short circuit. As described with reference to FIG. 3, the test circuit includes four switching circuits (602, 604, 606, and 608), each switching circuit including multiple switches 610 that are configured to selectably connect daisy chains of the first and second sets of daisy chains to a sense circuit (e.g., FIG. 5, 512), in response to a control circuit (not shown).

A short circuit is detected when there is continuity between a daisy chain of the first set and a daisy chain of the second set, which should be isolated from each other. As shown in FIG. 2, the crossing daisy chains 230 and 232 are isolated from each other because one signal line segment at the crossing point is implemented in the test circuit and the other is implemented in the IC under test. As the first and second sets of daisy chains are oriented perpendicular to each other, if continuity is detected between a daisy chain of the first set and a daisy chain in the second set, the short will be located at the location at which the daisy chains cross, where the micro-bump contacts of the daisy chains are in the closest proximity.

As shown in FIG. 6, switching circuits 602 and 606 are configured to connect the first set of daisy chains to a first terminal (Out), and switching circuits 604 and 608 are configured to connect the second set of daisy chains to a second terminal (In). Short circuits are detected by testing for continuity between the first and second data terminal. For example, the switches are configured by a controller to test for continuity between daisy chains 620 and 622. If continuity is detected, the location at which the daisy chains cross is determined to be the location of the short circuit. As both ends of a selected daisy chain (e.g., 622) are connected to the same data terminal (e.g., Out), the presence of an open circuit in that daisy chain is less likely to interrupt the circuit path of the short circuit and prevent detection.

In some implementations, the control circuit (not shown) is configured to cause switching circuits to connect multiple daisy chains in the first and second sets to the corresponding terminals to simultaneously check the multiple daisy chains for short circuits. If a short circuit is detected, the control circuit is configured to disconnect selected ones of the multiple daisy chains and retest for short circuits. The process is repeated until the short is isolated. In some particular implementations, the control circuit may be configured to cause the switching circuits to initially connect all of the daisy chains to the corresponding terminals and, in response to detection of a short circuit, select daisy chains for removal according to a binary search algorithm until the short circuit(s) are isolated. In each removal step, the binary search disconnects half of the connected daisy chains and checks to see if the short circuit is still detected. If a short is no longer detected the short is determined to be in the other half of the daisy chain. The selection and detection process is repeated with the other half of the daisy chains to further isolate the short circuit. Otherwise, if the short is still detected, short circuits may exist in either half of the daisy chains. The selection and detection process is repeated for each half to further isolate the short circuit(s).

Figure 7:
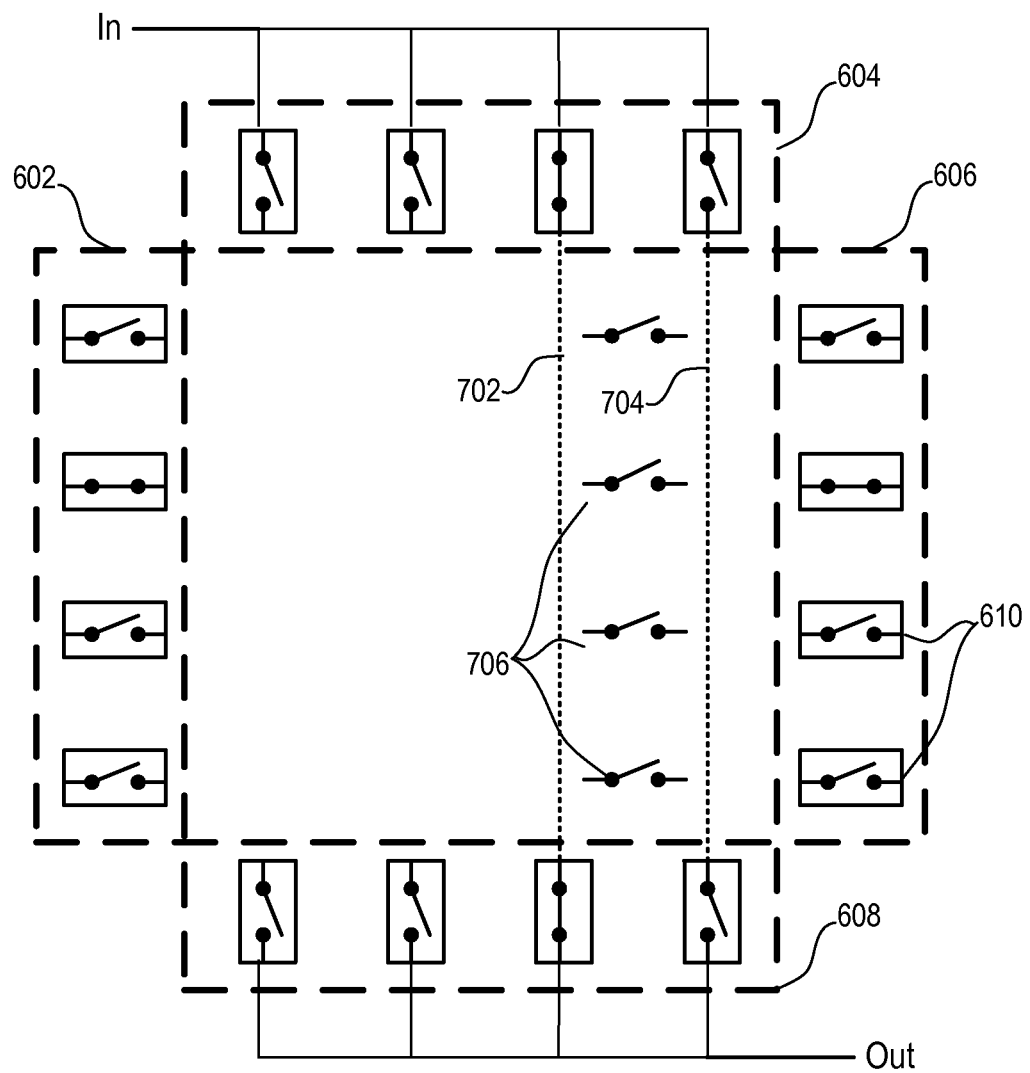
FIG. 7 shows the test circuit of FIG. 3 configured for testing micro-bump contacts to determine the locations of any open circuits.

FIG. 7 shows the test circuit of FIG. 3 configured for testing micro-bump contacts to determine the locations of open circuits. As described with reference to FIG. 6, the test circuit includes four switching circuits (602, 604, 606, and 608), each switching circuit having multiple switches 610 that are configured to selectably connect daisy chains of the first and second sets of daisy chains to a voltage source and a sense circuit (e.g., FIG. 5, 512), in response to a control circuit (not shown).

Open circuits are detected by individually checking each of the daisy chains for discontinuity. For instance, in the example shown in FIG. 7, switching circuits 604 and 608 are configured by a control circuit (not shown) to connect a first end of daisy chain 702 to a first terminal (In) and connect a second end of the daisy chain to a second terminal (Out). The first and second terminals are then checked for continuity. If an open circuit is detected (i.e., discontinuity), the control circuit is configured to locate the open circuit by bypassing different segments of the daisy chain until continuity is restored. If continuity is restored when one segment of the daisy chain is bypassed, the open circuit is determined to be in the bypassed segment(s). In the implementation shown in FIG. 7, the test circuit includes multiple switches (e.g., 706) that are disposed between adjacent daisy chains in each set. The switches 706 are controlled by the control circuit (not shown) to bypass different portions of the selected daisy chain (e.g., 702) through an adjacent daisy chain in the set (e.g., 704).

Figure 8:
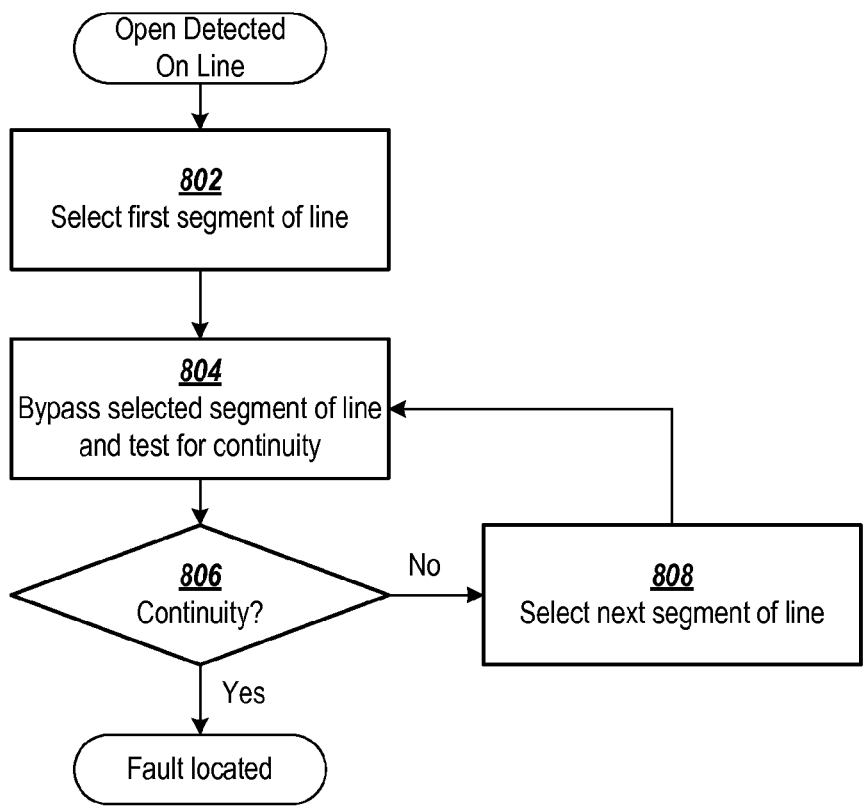
FIG. 8 shows a flowchart of an example process for determining the location of an open circuit fault using the configuration of the test circuit shown in FIG. 7.

FIG. 8 shows a flowchart of an example process for determining the location of an open circuit fault using the configuration of the test circuit shown in FIG. 7. In this example, in response to detection of an open circuit in a daisy chain, signal line segments are bypassed sequentially until the open circuit is located. In response to detecting an open circuit in a daisy chain, a first segment of the daisy chain is selected at block 802. The selected segment is bypassed and the daisy chain is retested for continuity at block 804. If continuity is not present at decision block 806, the previously bypassed segment is reconnected in the daisy chain and the next segment to bypass in the daisy chain is selected at block 808. The process is repeated by returning to block 804. Otherwise, if continuity is present at decision block 806, the open circuit is determined to be located at the bypassed signal line segment.

FIGS. 9-1 through 9-3 illustrate determination of the location of an open circuit fault using the method shown in FIG. 8. In this example, the location of an open circuit in a first daisy chain, connected between switches 902 and 906, is determined by sequentially bypassing various segments (910, 912, 914, and 916) with segments (920, 922, 924, and 928) of a second daisy chain, connected between switches 904 and 908.

FIG. 9-1 shows a configuration of switches between the daisy chains in which none of the segments are bypassed. In this example, an open circuit is located in segment 912. Discontinuity of the first daisy chain is represented by an "X" in the figure. As described in FIG. 8, in response to detecting discontinuity of the first daisy chain, segments of the daisy chain are sequentially bypassed until continuity is restored.

FIG. 9-2 shows a configuration of switches between the first and second daisy chains, in which segment 910 of the first daisy chain is bypassed through segment 920 of the second daisy chain. As continuity is not restored, the switches are reconfigured to bypass the next segment of the first daisy chain. FIG. 9-3 shows a configuration of switches between the first and second daisy chains in which segment 912 of the first daisy chain is bypassed through segment 922 of the second daisy chain. As a result of the bypass in FIG. 9-3, continuity is restored and the location of the open circuit has been determined.

The control circuit may be configured to bypass multiple segments of a daisy chain at the same time. If continuity is restored, the open circuit is determined to be located in one of the bypassed segments. In some particular implementations, the control circuit is configured to bypass segments in a binary search manner until the segment containing the open circuit is determined.

While the various embodiments are primarily described with reference to interposers, those skilled in the art will appreciate that the embodiments may be applicable to testing micro-bump contacts in a variety of other stacked ICs as well. It is intended that the specification and illustrated embodiments be considered as examples only, with a true scope of the invention being indicated by the following claims.

What is claimed is:

1. A semiconductor structure, comprising:
an interposer that includes routing circuitry, the routing circuitry including a plurality of signal line segments in one or more routing layers of the semiconductor structure;
a plurality of micro-bump contacts disposed on a surface of the interposer and coupled to the routing circuitry;
wherein each line segment of the plurality of signal line segments connects a pair of the plurality of micro-bump contacts, respectively; and
a plurality of test circuits stacked on the interposer, each test circuit coupled to a subset of the plurality of signal line segments via a respective subset of the micro-bump contacts, each test circuit configured to:
switchably connect a first pair of micro-bump contacts in the respective subset of micro-bump contacts to at least a second pair of micro-bump contacts in the respective subset of micro-bump contacts to form a first set of daisy chains of the subset of signal line segments and dynamically connect a third pair of micro-bump contacts in the respective subset of micro-bump contacts to at least a fourth pair of micro-bump contacts in the respective subset of micro-bump contacts to form a second set of daisy chains of the subset of signal line segments;
test for short circuits between the first set of daisy chains and the second set of daisy chains;
test the first and second sets of daisy chains for open circuits;

in response to detecting an open circuit in a daisy chain, determine a portion of the daisy chain in which the open circuit is located; and in response to detecting a short circuit between the first set of daisy chains and the second set of daisy chains, determine a location at which the first set of daisy chains is short circuited to the second set of daisy chains.

2. The semiconductor structure of claim 1, wherein each test circuit, in the determination of the location at which the first set of daisy chains are shorted to the second set of daisy chains, is further configured to determine a pair of micro-bump contacts that are connected together.

3. The semiconductor structure of claim 1, wherein each of the plurality of test circuits includes:
a first switching circuit configured to, in response to a first control signal indicating a first daisy chain of the first set of daisy chains, connect a first end of the first daisy chain to a first terminal;
a second switching circuit configured to, in response to a second control signal indicating the first daisy chain, connect a second end of the first daisy chain to a second terminal;
a third switching circuit configured to, in response to a third control signal indicating a second daisy chain of the second set of daisy chains, connect a first end of the second daisy chain to a third terminal;
a fourth switching circuit configured to, in response to a fourth control signal indicating the second daisy chain, connect a second end of the second daisy chain to a fourth terminal;
a sensing circuit connected to the first, second, third, and fourth terminals; and
a control circuit, coupled to the first, second, third, and fourth switching circuits, and configured to adjust the first, second, third, and fourth control signals.

4. The semiconductor structure of claim 1, wherein each of the plurality of test circuits is configured to test for short circuits between the first and second sets of daisy chains by, for each daisy chain of the first set of daisy chains:
connecting a first end and a second end of the daisy chain of the first set to a first terminal;
connecting a first end and a second end of one or more daisy chains of the second set to a second terminal; and
testing for continuity between the first and second terminals.

5. The semiconductor structure of claim 4, wherein,
the one of more daisy chains of the second set of daisy chains includes all of the daisy chains in the second set; and
the test circuit is further configured to, in response to detecting continuity between the first and second terminals, locate an electrical path that provides the continuity on the daisy chain of the first set by selecting a subset of the second set of daisy chains, connecting only the daisy chains in the subset of daisy chains to the second terminal, and repeating the testing for continuity between the first and second terminals, the selection of the subset being performed according to a binary search.

6. The semiconductor structure of claim 1, wherein the test circuit is configured to perform the determination of the portion of a first one of the daisy chains in which the open circuit is located by bypassing different segments of the daisy chain and testing the daisy chain for continuity.

7. The semiconductor structure of claim 6, wherein the test circuit is configured to perform the bypassing of different segments of the first daisy chain by connecting the first daisy chain to a second one of the daisy chains.

8. The semiconductor structure of claim 7, wherein the bypassing different segments of the daisy chain and testing the daisy chain for continuity, bypasses the segments of the daisy chain sequentially.

9. The semiconductor structure of claim 7, wherein the bypassing different segments of the daisy chain and testing the daisy chain for continuity, selects the different segments according to a binary search algorithm.

10. A semiconductor structure, comprising:
an interposer, the interposer including:
a plurality of solder balls arranged in an array;
a plurality of through-silicon-vias respectively connected to the solder balls;
a plurality of micro-bump contacts; and
routing circuitry connected to the plurality of micro-bump contacts and the plurality of through-silicon-vias, the routing circuitry including a first set of signal lines in a first routing layer of the interposer and a second set of signal lines in a second routing layer of the interposer; and
a plurality of test circuits stacked on the interposer, each test circuit coupled to a subset of the plurality of signal line segments via a respective subset of the micro-bump contacts, each test circuit configured to:
switchably connect micro-bump contacts in the respective subset of micro-bump contacts to form a first set of daisy chains of the subset of signal line segments and a second set of daisy chains of the subset of signal line segments;
test for short circuits between the first set of daisy chains and the second set of daisy chains;
test the first and second sets of daisy chains for open circuits;
in response to detecting an open circuit in a daisy chain, determine a portion of the daisy chain in which the open circuit is located; and
in response to detecting a short circuit between the first set of daisy chains and the second set of daisy chains, determine a location at which the first set of daisy chains is short circuited to the second set of daisy chains.

11. The semiconductor structure of claim 10, wherein:
each of the signal line segments connects a respective pair of the micro-bump contacts; and
each test circuit, in the determination of the portion of the daisy chain in which the open circuit is located, is further configured to determine an adjacent pair of the plurality of micro-bump contacts in the daisy chain between which there is discontinuity.

12. The semiconductor structure of claim 11, wherein each test circuit, in the determination of the location at which the first set of daisy chains are shorted to the second set of daisy chains, is further configured to determine a pair of micro-bump contacts that are connected together.

13. The semiconductor structure of claim 10, wherein each of the plurality of test circuits includes:
a first switching circuit configured to, in response to a first control signal indicating a first daisy chain of the first set of daisy chains, connect a first end of the first daisy chain to a first terminal;
a second switching circuit configured to, in response to a second control signal indicating the first daisy chain, connect a second end of the first daisy chain to a second terminal;

a third switching circuit configured to, in response to a third control signal indicating a second daisy chain of the second set of daisy chains, connect a first end of the second daisy chain to a third terminal;

a fourth switching circuit configured to, in response to a fourth control signal indicating the second daisy chain, connect a second end of the second daisy chain to a fourth terminal;

a sensing circuit connected to the first, second, third, and fourth terminals; and a control circuit, coupled to the first, second, third, and fourth switching circuits, and configured to adjust the first, second, third, and fourth control signals.

14. The semiconductor structure of claim 10, wherein each of the plurality of test circuits is configured to test for short circuits between the first and second sets of daisy chains by, for each daisy chain of the first set of daisy chains:

connecting a first end and a second end of the daisy chain of the first set to a first terminal;

connecting a first end and a second end of one or more daisy chains of the second set to a second terminal; and testing for continuity between the first and second terminals.

15. The semiconductor structure of claim 14, wherein:

the one of more daisy chains of the second set of daisy chains includes all of the daisy chains in the second set; and the test circuit is further configured to, in response to detecting continuity between the first and second terminals, locate an electrical path that provides the continuity on the daisy chain of the first set by selecting a subset of the second set of daisy chains, connecting only the daisy chains in the subset of daisy chains to the second terminal, and repeating the testing for continuity between the first and second terminals, the selection of the subset being performed according to a binary search.

16. The semiconductor structure of claim 10, wherein the test circuit is configured to perform the determination of the portion of a first one of the daisy chains in which the open circuit is located by bypassing different segments of the daisy chain and testing the daisy chain for continuity.

17. The semiconductor structure of claim 16, wherein the test circuit is configured to perform the bypassing of different segments of the first daisy chain by connecting the first daisy chain to a second one of the daisy chains.

18. The semiconductor structure of claim 17, wherein the bypassing different segments of the daisy chain and testing the daisy chain for continuity, selects the different segments according to a binary search algorithm.

19. A method of testing micro-bump contacts of an interposer, comprising:

mounting a plurality of test circuits having respective arrays of micro-bump contacts on respective subsets of the micro-bump contacts of the interposer, wherein pairs of the micro-bump contacts are connected by signal line segments in the interposer;

connecting with switches in the plurality of test circuits, a first pair of micro-bump contacts in the respective subset of micro-bump contacts to at least a second pair of micro-bump contacts in the respective subset of micro-bump contacts to form a respective first set of daisy chains, and a third pair of micro-bump contacts in the respective subset of micro-bump contacts to at least a fourth pair of micro-bump contacts in the respective subset of micro-bump contacts to form a respective second set of daisy chains;

testing for short circuits between the first set of daisy chains and the second set of daisy chains;

testing the first and second sets of daisy chains for open circuits;

in response to detecting an open circuit in a daisy chain, determining a portion of the daisy chain in which the open circuit is located; and in response to detecting a short circuit between the first set of daisy chains and the second set of daisy chains, determining a location at which the first set of daisy chains is short circuited to the second set of daisy chains.

* * * * *